United States Patent
Hachiya et al.

[11] Patent Number: 5,854,133
[45] Date of Patent: Dec. 29, 1998

[54] METHOD FOR MANUFACTURING A SEMICONDUCTOR DEVICE

[75] Inventors: Takayo Hachiya, Yokohama; Moto Yabuki, Tokyo; Hiroyuki Kamijou, Yokkaichi, all of Japan

[73] Assignee: Kabushiki Kaisha Toshiba, Kawasaki, Japan

[21] Appl. No.: 698,200

[22] Filed: Aug. 15, 1996

[30] Foreign Application Priority Data

Aug. 30, 1995 [JP] Japan ................... 7-222149

[51] Int. Cl.⁶ ................ H01L 21/463; H01L 21/302
[52] U.S. Cl. .............. 438/692; 438/693; 438/695; 438/697; 438/699; 438/753; 438/756
[58] Field of Search ................ 438/692, 693, 438/695, 697, 699, 753, 756

[56] References Cited

U.S. PATENT DOCUMENTS

| | | | |
|---|---|---|---|
| 5,314,843 | 5/1994 | Yu et al. | 438/692 |
| 5,395,801 | 3/1995 | Doan et al. | 438/692 |
| 5,491,113 | 2/1996 | Murota | 438/692 |
| 5,502,007 | 3/1996 | Murase | 438/692 |
| 5,512,163 | 4/1996 | Warfield | 438/692 |
| 5,560,802 | 10/1996 | Chisholm | 438/692 |
| 5,607,718 | 3/1997 | Sasaki et al. | 438/693 |
| 5,629,242 | 5/1997 | Nagashima et al. | 438/692 |
| 5,674,783 | 10/1997 | Jang et al. | 438/692 |
| 5,674,784 | 10/1997 | Jang et al. | 438/692 |

FOREIGN PATENT DOCUMENTS 6-295908  10/1994  Japan .

*Primary Examiner*—Anthony Green
*Attorney, Agent, or Firm*—Finnegan, Henderson, Farabow, Garrett & Dunner, L.L.P.

[57] ABSTRACT

According to the present invention, to flatten the surface of a silicon substrate by polishing an element isolating buried insulation film by chemical mechanical polishing, a polysilicon film is formed on the top surface of a projection of a silicon substrate. After that, a buried insulation film is formed all over the silicon substrate along the irregularities thereof. A carbon film is formed on the surface of a recess of the buried insulation film. Using the carbon film as a stopper, the buried insulation film is polished by the chemical mechanical polishing to ease the irregularities of the surface of the polished insulation film. Then the carbon film is removed and, using the polysilicon film as a stopper, the buried insulation film is polished by the chemical mechanical polishing to flatten the surface of the polished insulation film. Thus, the flatness of the buried insulation film can easily be controlled, and the surface of the silicon substrate can always be flattened satisfactorily.

9 Claims, 3 Drawing Sheets

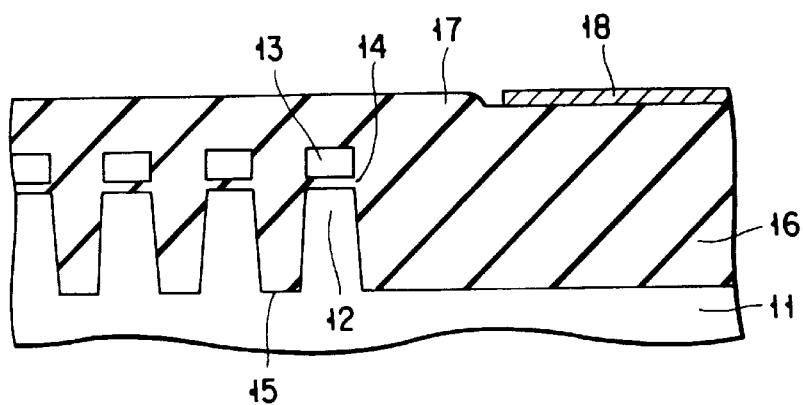
F I G. 4D
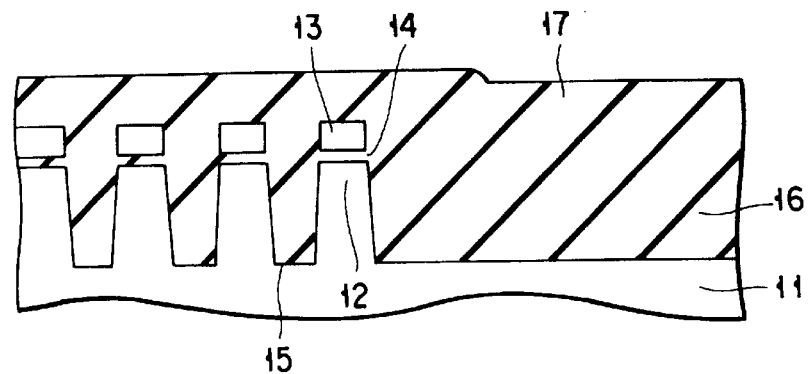
F I G. 4E
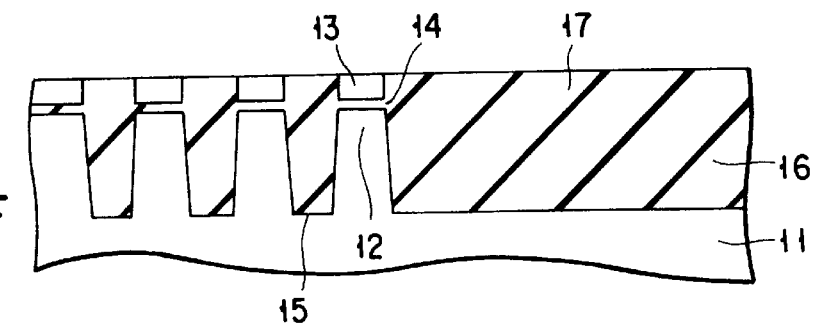
F I G. 4F
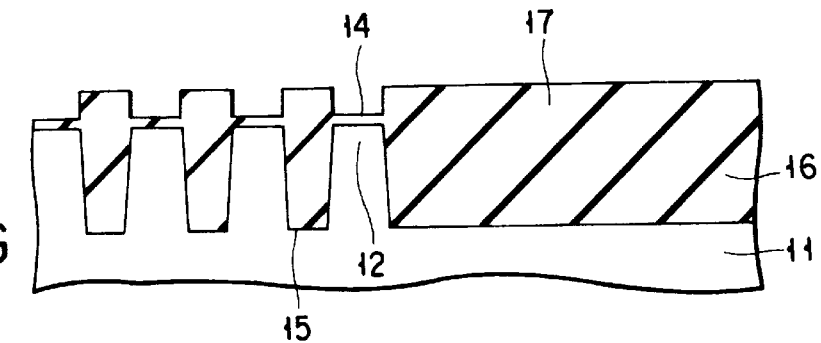
F I G. 4G

METHOD FOR MANUFACTURING A SEMICONDUCTOR DEVICE

BACKGROUND OF THE INVENTION

1. Field of the Invention

The present invention relates to a method for manufacturing a semiconductor device and, more specifically, to CMP (Chemical Mechanical Polishing) for flattening the surface of a semiconductor substrate.

2. Description of the Related Art

As a technique of isolating elements in a semiconductor device, buried element isolation is well-known in which a buried insulation region is provided between the elements. According to this technique, an insulation film is formed on a semiconductor substrate so as to fill an element isolating groove and then the insulation film formed except in the groove is removed to flatten the surface of the semiconductor substrate. Recently CMP has been used widely for flattening the surface of a semiconductor substrate. In the CMP, the surface of the substrate is selectively polished to eliminate the irregularities thereof.

FIGS. 1A and 1B schematically show a prior art process of flattening the surface of a semiconductor substrate by the CMP described above.

For example, as shown in FIG. 1A, when element isolation is performed by forming a buried insulation region, a first protection film 3 is formed above a projection 1a (element forming region) on the surface of a semiconductor substrate 1 with a view to protecting the projection 1a. To prevent a buried insulation film 2 from reducing in a wide range of recess 1b, a second protection film 4 is formed on the buried insulation film 2 in the recess 1b. After the first and second protection films 3 and 4 are formed, the surface of the resultant structure is flattened by the CMP, which is disclosed in, for example, Jpn. Pat. Appln. KOKAI Publication No. 6-295908. If, as shown in FIG. 1B, the first and second protection films 3 and 4 are substantially flush with each other, the flattening can be performed easily.

If, however, they are not flush with each other, the flattening is difficult to perform satisfactorily. For example, as illustrated in FIGS. 2A and 2B, when the level of the second protection film 4 is higher than that of the first protection film 3, the buried insulation film 2 is not polished but remains on the first protection film 3. On the contrary, as shown in FIGS. 3A and 3B, when the level of the first protection film 3 is higher than that of the second protection film 4, the projection 1a on the surface of the semiconductor substrate 1 is polished too much by mistake.

To make the first and second protection films 3 and 4 flush with each other in the process of manufacturing a semiconductor device is very difficult since an element isolating groove varies in depth and buried insulation film 2 varies in thickness. For this reason, the prior art process has the drawback wherein the constant flatness of the semiconductor substrate cannot be achieved stably.

SUMMARY OF THE INVENTION

An object of the present invention is to provide a method for manufacturing a semiconductor device which is capable of flattening the surface of a semiconductor substrate satisfactorily through a simple process thereby to always stabilize the flatness of the semiconductor substrate.

To attain the above object, according to one aspect of the present invention, there is provided a method for manufacturing a semiconductor device, wherein a to-be-polished film is formed on a semi-conductor substrate having a recess and a projection on a surface thereof, and polished using each of a plurality of protection films whose levels differ from one another.

According to another aspect of the present invention, there is provided a method for manufacturing a semiconductor device, comprising the steps of:

forming a first protection film on a top surface of a projection of a semiconductor substrate, the semiconductor substrate having a recess as well as the projection;

forming a to-be-polished film along the projection and the recess of the semiconductor substrate including the first protection film;

forming a second protection film on a surface of the to-be-polished film corresponding to the recess such that the second protection film is located higher than a surface of the first protection film;

polishing the to-be-polished film by chemical mechanical polishing using the second protection film as a stopper, and easing irregularities of a surface of the polished to-be-polished film; and removing the second protection film, then polishing the to-be-polished film again by the chemical mechanical polishing using the first protection film as a stopper, and flattening a surface of the polished to-be-polished film.

According to still another aspect of the present invention, there is provided a method for manufacturing a semiconductor device, comprising the steps of:

forming a first protection film on a semiconductor substrate with an oxide film interposed therebetween and selectively forming a recess on a surface of the semiconductor substrate including the first protection film;

forming a buried insulation film on an entire surface of the semiconductor substrate to fill the recess;

forming a second protection film on a surface of the buried insulation film corresponding to the recess such that the second protection film is located higher than a surface of the first protection film;

polishing the buried insulation film by chemical mechanical polishing using the second protection film as a stopper, and easing irregularities of a surface of the polished buried insulation film; and removing the second protection film, then polishing the buried insulation film again by the chemical mechanical polishing using the first protection film as a stopper, and flattening a surface of the polished buried insulation film.

According to the method of manufacturing a semiconductor device according to the present invention, the irregularities of the surface of a to-be-polished film are almost removed first, and then the remaining irregularities thereon are completely removed. It is thus unnecessary to make a plurality of protection films flush with one another, and it is possible to easily improve the flatness of the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIGS. 4A to 4G are cross-sectional views schematically showing a process of flattening the surface of a semiconductor substrate according to an embodiment of the present invention.

DETAILED DESCRIPTION OF THE PREFERRED EMBODIMENTS

An embodiment of the present invention will now be described with reference to the accompanying drawings.

FIGS. 4A to 4G are cross-sectional views schematically showing a process of flattening the surface of a semiconductor substrate according to the embodiment of the present invention. This embodiment is applied to a so-called buried element isolation technique for flattening the surface of a semiconductor substrate, in which a buried insulation region is provided between elements to isolate the elements.

Figure 1A:
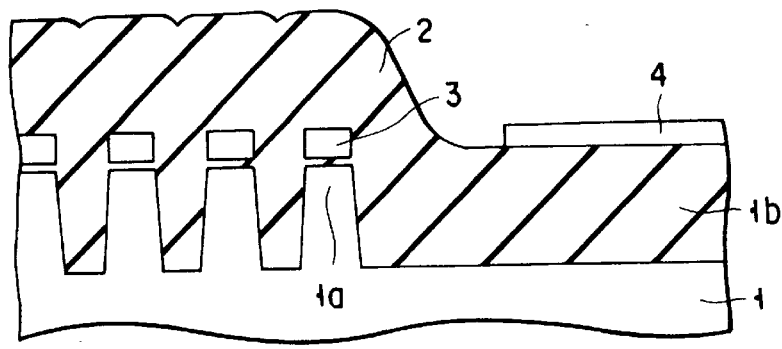
FIGS. 1A and 1B are cross-sectional views schematically showing a prior art process of flattening the surface of a semiconductor substrate, in order to describe the drawback of the prior art process.
Figure 1B:
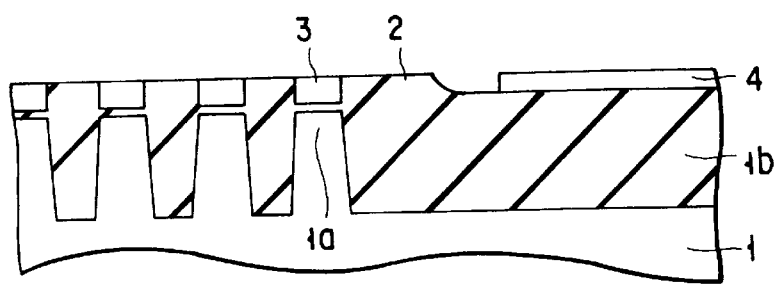
Figure 2A:
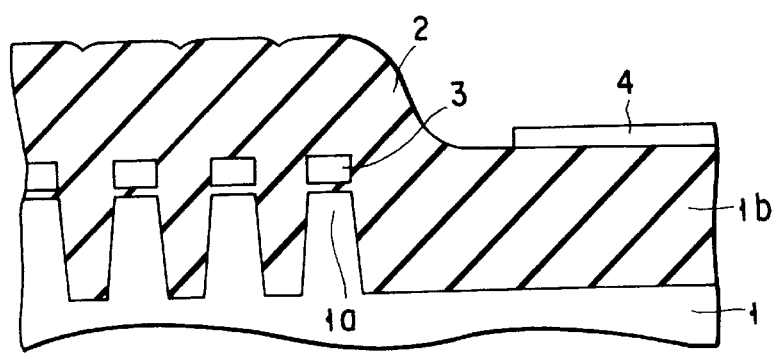
FIGS. 2A and 2B are cross-sectional views schematically showing a prior art process of flattening the surface of a semiconductor substrate in which a second protection film is higher in level than a first protection film.
Figure 2B:
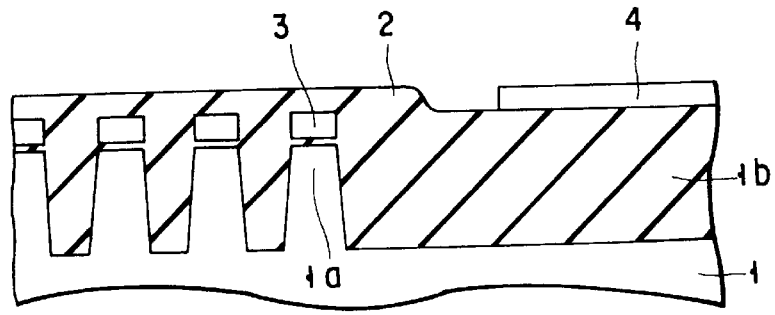
Figure 3A:
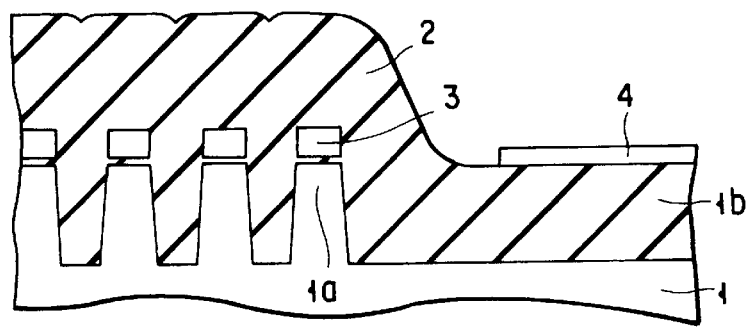
FIGS. 3A and 3B are cross-sectional views schematically showing a prior art process of flattening the surface of a semiconductor substrate in which a first protection film is higher in level than a second protection film.
Figure 3B:
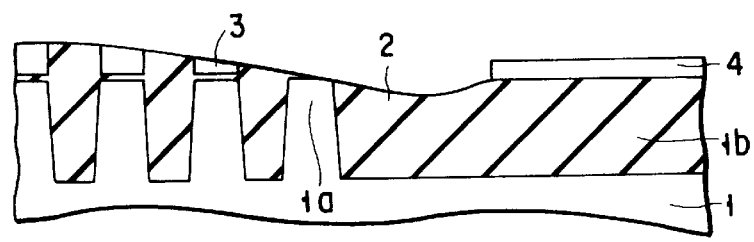
Figure 4A:
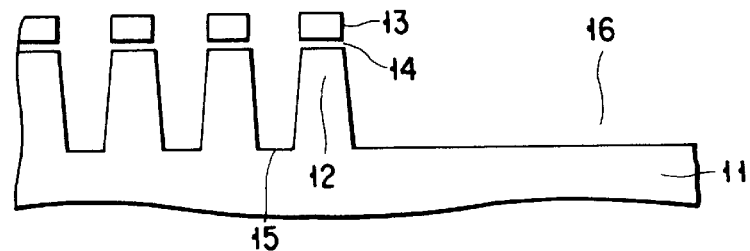

First polysilicon films (first protection film) 13 are formed on the surface of a silicon substrate 11 serving as a semiconductor substrate and, for example, above projections 12 each serving as an element forming region (see FIG. 4A). The polysilicon films 13 function as stopper layers in polishing (flattening) a buried insulation film (a to-be-polished film) remaining on each of the projections 12 in the second polishing step of the CMP.

The polysilicon films 13 are formed as follows. A silicon oxide film 14 having a thickness of about 200 angstroms is formed on the entire surface of the silicon substrate 11 by, e.g., thermal oxidation. On the silicon oxide film 14, a polysilicon film having a thickness of about 1000 angstroms by, e.g., LPCVD (Low Pressure Chemical Vapor Deposition). A mask is formed by patterning a resist film, not shown, and then the polysilicon film 13 formed except above the projections 12, silicon oxide film 14 and silicon substrate 11 are removed to form recesses 15 and 16 serving as element isolation regions. These recesses 15 and 16 are provided by anisotropically forming grooves each having a depth of about 3000 angstroms in the silicon substrate 11 by RIE (Reactive Ion Etching) using, e.g., HBr gas. The recesses 15 of narrow regions and the recess 16 of a wide region are selectively formed on the silicon substrate 11, with the result that the polysilicon films 13 are formed above the projections 12 with the silicon oxide film 14 interposed therebetween.

Figure 4B:
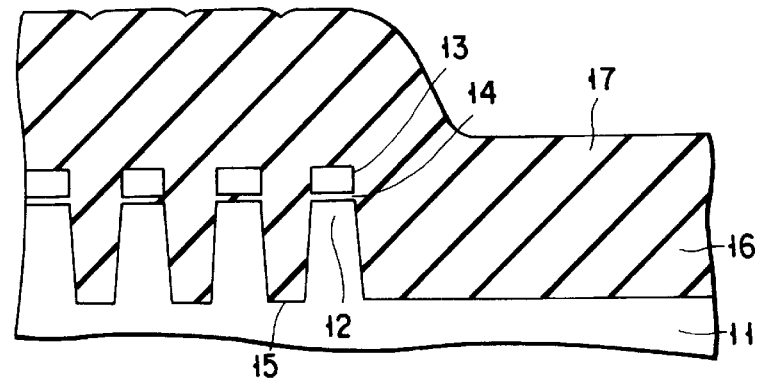

A buried insulation film 17 for filling the recesses 15 and 16 is formed all over the silicon substrate 11 (see FIG. 4B). The polishing speed of the buried insulation film 17 is higher than that of the polysilicon film 13. The insulation film 17 is constituted of a silicon oxide film such as a TEOS (Tetra Ethoxy Silane) film and formed by the LPCVD to have a thickness of about 5000 angstroms. The thickness of the insulation film 17 is set to be 4200 angstroms or more such that the surface of a posteriorly-formed carbon film (second protection film) is located higher than that of the polysilicon film 13.

Figure 4C:
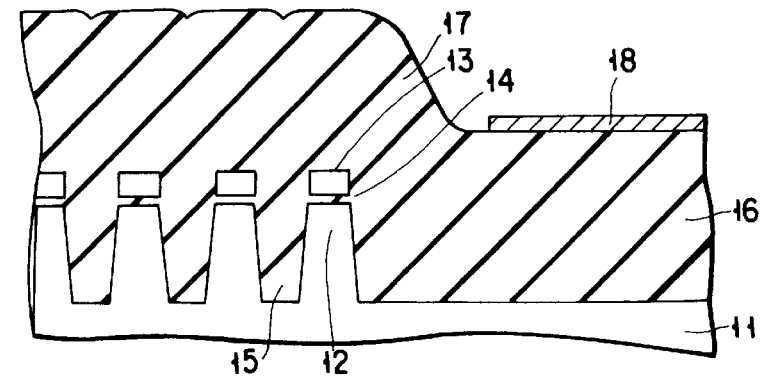

A carbon film 18 is selectively formed only on that portion of the buried insulation film 17 which corresponds to the recess 16 having a relatively large area (see FIG. 4C). The polishing speed of the carbon film 18 is lower than that of the buried insulation film 17. The carbon film 18 functions as a stopper in roughly polishing the buried insulation film 17 on the projections 12 in the first polishing step of the CMP. The carbon film 18 is formed by forming carbon all over the buried insulation film 17 by, e.g., sputtering and then patterning the carbon by the RIE using $O_2$ gas such that the carbon remains only on that portion of the insulation film 17 which corresponds to the recess 16. If the thickness of the insulation film 17 is 4200 angstroms or more, the carbon film 18 is always located higher than the polysilicon film 13 formed above the projections 12, even though the carbon film 18 is thin.

The first polishing step in which the carbon film 18 serves as a stopper, is executed by the CMP using an abrasive such as $CeO_2$ (see FIG. 4D). In this first polishing step, the CMP is performed roughly such that the buried insulation film 17 remains a little on the projections 12, in order to ease the irregularities of the insulation film 17. In other words, since the carbon film 18 is located higher than the polysilicon films 13, the first polishing step is completed before the polishing reaches the polysilicon films 13 formed above the projection 12.

After that, the carbon film 18 is removed by ashing (see FIG. 4E).

The CMP using an abrasive such as $CeO_2$ is repeated to execute the second polishing step in which the polysilicon films 13 serve as stoppers (see FIG. 4F). In the second polishing step, the polishing is performed such that all the buried insulation film 17 remaining on the projections 12 can be eliminated in order to expose the polysilicon films 13, thus flattening the surface of the insulation film 17. As a result, a buried insulation region is obtained by burying the insulation film 17 into the recesses 15 and 16 thereby to isolate the projections 12 from one another.

Finally the polysilicon films 13 exposed from the surface of the buried insulation film 17 are eliminated by CDE (Chemical Dry Etching) using, e.g., a mixture of $CF_4$, $O_2$ and $N_2$, and the flattening process ends (see FIG. 4G).

After that, through a process of forming semiconductor elements for the projections 12, a semiconductor device having a buried element isolating structure wherein the elements are isolated by a buried insulation region, is obtained.

As described above, the irregularities of the surface of the buried insulation film are almost eliminated by the CMP using the carbon film as a stopper, and then the remaining irregularities on the buried insulation film are completely removed by the CMP using the polysilicon film as a stopper. In other words, the first polishing step wherein the carbon film is used as a stopper to ease the irregularities of the buried insulation film and the second polishing step wherein the polysilicon film is used as a stopper to flatten the surface of the silicon substrate by completely eliminating the irregularities of the buried insulation film are executed. Since the carbon film and polysilicon film function as stoppers in their respective polishing steps, the surface of the substrate can be flattened satisfactorily without always making the polysilicon film and carbon film flush with each other.

Consequently, the flatness of the substrate can easily be maintained with constant stability through the simple process, and the height of each of the polysilicon and carbon films can easily be controlled by controlling the thickness of the buried insulation film. For example, the buried insulation film is formed such that its surface in the recesses is at least on a level with that of the polysilicon film; therefore, the carbon film can be always formed higher than the polysilicon film. Since, furthermore, the buried insulation film remaining on the polysilicon films is very thin, the buried insulation film remaining on the projections can easily be eliminated without much effort in the second polishing step, and the buried insulation films in the recesses are unlikely to decrease in thickness. Even if the distance between the carbon and polysilicon films is shortened in accordance with the variety of pattern size, the buried insulation film can reliably be prevented from remaining therebetween.

In the foregoing embodiment of the present invention, the surface of the carbon film is located higher than that of the polysilicon film by considerably thickening the buried insulation film. The present invention is not limited to this case; however, for example, the buried insulation film in the recess can be formed at least higher than the bottom surface of the polysilicon film. If a sufficiently thick carbon film is formed, the same advantage as that of the first embodiment can be obtained. (However, the thickness of the carbon film has to be controlled such that its surface is always located lower than that of the buried insulation film above the projection.)

In the first polishing step of the embodiment, the buried insulation film is polished roughly such that it is partly remains. For example, when the levels of the carbon and polysilicon films are substantially the same, it does not matter if the buried insulation film is polished until the surface of the polysilicon film is exposed.

The polysilicon film is employed as the first protection film; however, it can be replaced with a silicon nitride (SiN) film whose polishing speed is lower than that of the buried insulation film.

The second protection film is not limited to the carbon film. For example, it can be replaced with a polysilicon film, a SiN film, a WSi film, a W film, a TiN film or the like, whose polishing speed is lower than that of the buried insulation film.

An abrasive other than $CeO_2$ can be used and, in this case, a protection film, which is harder to polish than the buried insulation film, has only to be used for the first and second protection films.

The polysilicon film exposed from the surface of the buried insulation film can be eliminated even by, e.g., the wet etching using $H_3PO_4$.

The present invention can be applied to a method for flattening an interlayer insulation film or a buried wiring layer other than the above-described buried insulation film for isolating the elements.

It is needless to say that various changes and modifications can be made without departing from the scope of the subject matter of the present invention.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing a semiconductor device, comprising the steps of:

preparing a semiconductor substrate having a projection at a first part:

forming an intermediate film on the surface of the substrate;

forming a first protection film on a top surface of said projection on said intermediate film;

forming a buried insulation film covering said substrate and said first protection film;

forming a second protection film at a level higher than a top surface of said first protection film and on that part of said buried insulation film which is located above a part of said substrate which is other than said first part;

polishing said buried insulation film by chemical mechanical polishing using said second protection film as a stopper, thereby easing irregularities of a polished surface of said buried insulation film;

removing said second protection film;

polishing said buried insulation film by chemical mechanical polishing using said first protection film as a stopper, thereby flattening a polished surface of said buried insulation film.

2. The method according to claim 1, wherein said second protection film has a polishing speed which is lower than that of said buried insulation film.

3. The method according to claim 1, wherein said second protection film includes a carbon film.

4. The method according to claims 1, wherein said intermediate film is an oxide film.

5. A method for manufacturing a semiconductor device, comprising the steps of:

preparing a semiconductor substrate having a projection at a first part;

forming a first protection film on said projection with an oxide film interposed therebetween;

forming a buried insulation film covering said substrate and said first protection film;

forming a second protection film at a level higher than a top surface of said first protection film and on that part of said buried insulation film which is located above a part of said substrate which is other than said first part;

polishing said buried insulation film by chemical mechanical polishing using said second protection film as a stopper, thereby easing irregularities of a polished surface of said buried insulation film; and removing said second protection film;

polishing said buried insulation film by chemical mechanical polishing using said first protection film as a stopper, thereby flattening a polished surface of said buried insulation film.

6. The method according to claim 5, wherein said second protection film has a polishing speed which is lower than that of said buried insulation film.

7. The method according to claim 5, wherein said second protection film includes a carbon film.

8. A method for manufacturing a semiconductor device, comprising the steps of:

preparing a semiconductor substrate having a projection at a first part;

forming a first protection film on a top surface of said projection;

forming a buried insulation film covering said substrate and said first protection film;

forming a second protection film at a level higher than a top surface of said first protection film and on that part of said buried insulation film which is located above a part of said substrate which is other than said first part;

polishing said buried insulation film by chemical mechanical polishing using said second protection film as a stopper, thereby easing irregularities of a polished surface of said buried insulation film; and removing said second protection film;

polishing said buried insulation film by chemical mechanical polishing using said first protection film as a stopper, thereby flattening a polished surface of said buried insulation film;

wherein said second protection film includes a carbon film.

9. The method according to claim 8, wherein said second protection film has a polishing speed which is lower than that of said buried insulation film.

* * * * *